US008255769B2

(12) United States Patent
Funaki et al.

(10) Patent No.: US 8,255,769 B2
(45) Date of Patent: Aug. 28, 2012

(54) CONTROL APPARATUS AND CONTROL METHOD

(75) Inventors: Satoru Funaki, Hitachi (JP); Yasuhiro Kiyofuji, Hitachi (JP); Masashi Suenaga, Hitachi (JP); Shin Kokura, Hitachi (JP); Eiji Kobayashi, Hitachinaka (JP); Akihiro Onozuka, Hitachi (JP); Yusuke Seki, Hitachi (JP); Toshiki Shimizu, Hitachi (JP); Yukiko Tahara, Hitachi (JP); Yuta Sugimoto, Hitachi (JP)

(73) Assignees: Hitachi, Ltd., Tokyo (JP); Hitachi Information & Control Solutions, Ltd., Ibaraki (JP)

( * ) Notice: Subject to any disclaimer, the term of this patent is extended or adjusted under 35 U.S.C. 154(b) by 305 days.

(21) Appl. No.: 12/652,773

(22) Filed: Jan. 6, 2010

(65) Prior Publication Data

US 2010/0174967 A1    Jul. 8, 2010

(30) Foreign Application Priority Data

Jan. 7, 2009   (JP) .................................. 2009-001899

(51) Int. Cl.
    *G11C 29/00*        (2006.01)
(52) U.S. Cl. ......... 714/763; 714/746; 714/752; 714/819
(58) Field of Classification Search .................... 714/11, 714/819, 746, 752, 763
    See application file for complete search history.

(56) References Cited

U.S. PATENT DOCUMENTS 4,672,537 A * 6/1987 Katzman et al. ............... 714/56
4,916,704 A * 4/1990 Bruckert et al. ............... 714/11
5,086,429 A * 2/1992 Gray et al. .................... 714/13
5,136,704 A * 8/1992 Danielsen et al. ............. 714/11
5,271,023 A * 12/1993 Norman ........................ 714/10
5,313,386 A * 5/1994 Cook et al. .................... 700/82
5,504,859 A * 4/1996 Gustafson et al. ............ 714/11
5,630,056 A * 5/1997 Horvath et al. ............... 714/56
5,689,632 A * 11/1997 Galy et al. .................... 714/11
5,742,851 A * 4/1998 Sekine ........................... 714/43

(Continued)

FOREIGN PATENT DOCUMENTS

JP        2006-344087        12/2006

(Continued)

OTHER PUBLICATIONS

Functional safety of electrical/electronic/programmable electronic safety-related systems; CEI/IEC 61508-1:1998.

*Primary Examiner* — Yolanda L Wilson
(74) *Attorney, Agent, or Firm* — Antonelli, Terry, Stout & Kraus, LLP.

(57) ABSTRACT

A failure is detected immediately and certainly, and continuation of processing in an unstable state is prevented. A first error detection code is generated from first information which is output as a result of execution of a predetermined program conducted by a first processor. A second error detection code is generated from second information which is output as a result of execution of the program conducted by a second processor which is configured so as to output the same computation result as that of the first processor. It is detected whether the first information is the same as the second information, and it is detected whether the first error detection code is the same as the second error detection code. Writing the first information or the second information into a main memory is controlled on the basis of a result of the detection.

9 Claims, 9 Drawing Sheets

U.S. PATENT DOCUMENTS

| | | | |
|---|---|---|---|
| 6,065,135 A * | 5/2000 | Marshall et al. | 714/11 |
| 6,173,414 B1 * | 1/2001 | Zumkehr et al. | 714/6.24 |
| 6,216,236 B1 * | 4/2001 | Miyao et al. | 714/11 |
| 6,237,108 B1 * | 5/2001 | Ogawa et al. | 714/6.32 |
| 6,694,449 B2 * | 2/2004 | Ghameshlu et al. | 714/11 |
| 6,751,749 B2 * | 6/2004 | Hofstee et al. | 714/11 |
| 6,772,368 B2 * | 8/2004 | Dhong et al. | 714/11 |
| 6,779,128 B1 | 8/2004 | Gale et al. | |
| 6,880,119 B1 * | 4/2005 | Bohlin | 714/732 |
| 7,055,060 B2 * | 5/2006 | Nguyen et al. | 714/11 |
| 7,134,047 B2 * | 11/2006 | Quach | 714/11 |
| 7,137,028 B2 * | 11/2006 | Smith | 714/10 |
| 7,308,605 B2 * | 12/2007 | Jardine et al. | 714/11 |
| 7,797,575 B2 * | 9/2010 | Clark et al. | 714/11 |
| 2002/0157056 A1 * | 10/2002 | Chaudhry et al. | 714/763 |
| 2006/0282702 A1 | 12/2006 | Bando et al. | |
| 2008/0013475 A1 | 1/2008 | Bandou et al. | |

FOREIGN PATENT DOCUMENTS

| | | |
|---|---|---|
| JP | 2007-011639 | 1/2007 |
| JP | 2008-009796 | 1/2008 |

* cited by examiner

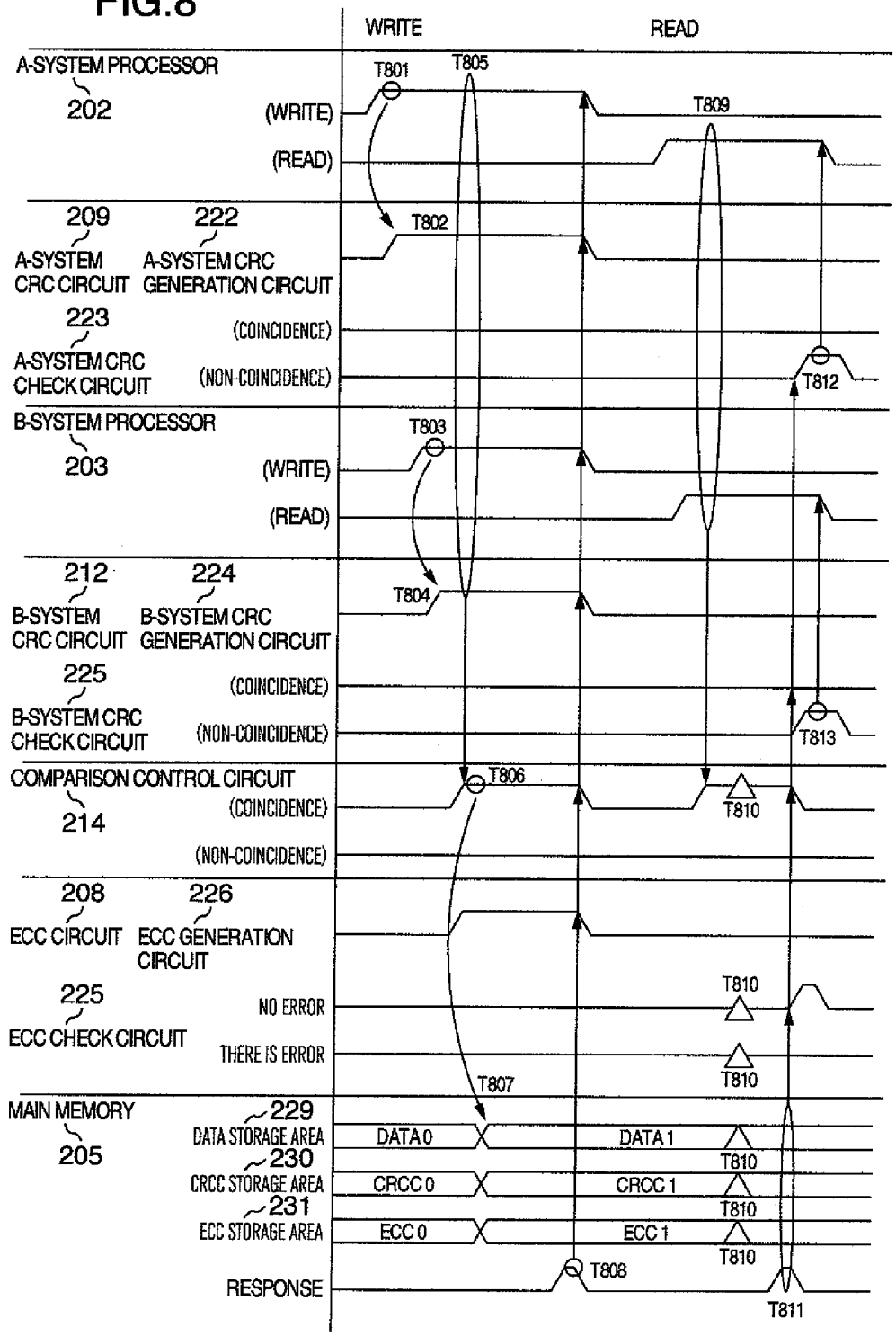

FIG.9A

| FAILURE DETECTION OBJECT / FAILURE DETECTION UNIT | PROCESSOR | CRC CIRCUIT | PROCESSOR BUS | COMPARISON CONTROL CIRCUIT | INTERNAL BUS | ECC CIRCUIT | MEMORY BUS | MAIN MEMORY |
|---|---|---|---|---|---|---|---|---|
| CRC CIRCUIT | — | — | DIAGNOSIS | DIAGNOSIS | DIAGNOSIS | DIAGNOSIS | DIAGNOSIS | DIAGNOSIS |
| COMPARISON CONTROL CIRCUIT | DIAGNOSIS | DIAGNOSIS | DIAGNOSIS | — | — | — | — | — |
| ECC CIRCUIT | — | — | — | — | — | — | DIAGNOSIS | DIAGNOSIS |

FIG.9B

| FAILURE DETECTION OBJECT / FAILURE DETECTION UNIT | PROCESSOR | CRC CIRCUIT | PROCESSOR BUS | COMPARISON CONTROL CIRCUIT | INTERNAL BUS | ECC CIRCUIT | MEMORY BUS | MAIN MEMORY |
|---|---|---|---|---|---|---|---|---|
| CRC CIRCUIT | — | — | DIAGNOSIS | DIAGNOSIS | DIAGNOSIS | DIAGNOSIS | DIAGNOSIS | DIAGNOSIS |
| COMPARISON CONTROL CIRCUIT | DIAGNOSIS | DIAGNOSIS | DIAGNOSIS | — | — | — | — | — |
| ECC CIRCUIT | — | — | — | — | — | — | DIAGNOSIS | DIAGNOSIS |
| DIAGNOSTIC OPERATION PROGRAM | — | CRC DIAGNOSTIC OPERATION ABNORMAL INJECTION | WRITE READBACK CHECK | COMPARISON DIAGNOSTIC ABNORMAL INJECTION | WRITE READBACK CHECK | ECC CIRCUIT DIAGNOSTIC OPERATION ABNORMAL INJECTION | WRITE READBACK CHECK | — |

CONTROL APPARATUS AND CONTROL METHOD

INCORPORATION BY REFERENCE

The present application claims priority from Japanese applications JP2009-001899 filed on Jan. 7, 2009, the content of which is hereby incorporated by reference into this application.

BACKGROUND OF THE INVENTION

The present invention relates to a control apparatus provided in a programmable electronic apparatus and a control method for the electronic apparatus.

In process facilities such as atomic power plants and chemical plants which are potentially very dangerous, a passive countermeasure using protection facilities such as barriers and an active countermeasure using a safety apparatus such as an emergency stop apparatus are taken in order to reduce influences upon workers and the peripheral environment in an emergent situation. Among them, control of the safety apparatus is conventionally implemented by electromagnetic and mechanical means such as relays.

As techniques in programmable control devices represented by programmable logic controllers (PLCs) advances in recent years, however, needs for utilization of them as control means of the safety control system are increasing.

For example, IEC 61508-1 is an international standard published to cope with such a trend. Requirements in the case where an electrical/electronic/programmable electronic device is utilized in a part of a safety control system are prescribed therein (IEC 61508-1 to 7, "Functional safety of electrical/electronic/programmable electronic safety-related systems" part 1 to part 7 (Non-Patent Document 1)).

In IEC 61508, SIL (Safety Integrity Level) is defined as a faculty measure of a safety control system. Requirement items corresponding to levels 1 to 4 are prescribed. As the SIL becomes higher, it is indicated that the degree to which potential dangers involved in the process facilities can be reduced becomes higher. In other words, it indicates how certainly predetermined safety control can be executed when an abnormality of process facilities is detected.

It is demanded to activate the safety control apparatus immediately when an abnormality has occurred in process facilities even if the safety control apparatus is inactive in the ordinary operation state. Therefore, it becomes important to always make a self-diagnosis and continue to check the soundness of itself. In the safety control system a high SIL is required of, it is necessary to make wide-range high-precision self-diagnoses in order to minimize the probability that the system will malfunction due to an undetected failure.

In the IEC 61508, self-diagnosis techniques are presented to use for each of the kinds of components that constitute the safety control apparatus, and the effectiveness of each technique is indicated in a form of diagnostic rate. The diagnostic rate indicates the rate of detectable failures when the diagnostic technique is adopted, relative to all failures in each component. It is said that the maximum diagnostic rate of 99% can be claimed in, for example, the diagnostic technique "Abraham" of RAM (U.S. Pat. No. 6,779,128, (Patent Document 2)).

In addition, as the failure detection means for a processor which is one of components of the PLC, it is effective to employ a method of monitoring the matching between output results by using a plurality of processors.

As a method for mutually diagnosing outputs of a plurality of processors, it is effective that processors execute similar control processing at the same time and confirm coincidence of outputs.

For example, there is a technique for immediately detecting a processor failure, if any, by comparing outputs of a plurality of processors operating asynchronously (JP-A-2007-11639 (Patent Document 1)).

SUMMARY OF THE INVENTION

According to the technique disclosed in JP-A-2007-11639 (Patent Document 1)), a diagnosis can be made on processors by using a unit for conducting comparison between micro-processors. If a failure occurs in a memory interface ranging from an output of the unit for conducting comparison between micro-processors to a main memory, however, failure detection using software must be conducted because there is no detection units using hardware. As for the diagnostic processing of processors using software, a diagnosis on the memory interface can be made by writing an expected value, reading back it and conducting comparison. During real operation time between nth diagnostic processing and (n+1)st diagnostic processing, however, there is a possibility that operation will be continued while remaining in the unstable state because an abnormality cannot be detected, resulting in a problem.

The present invention has been made in view of these circumstances, and an object thereof is to make it possible to detect a failure instantaneously and certainly and prevent processing from being continued in the unstable state.

In order to achieve the object at the time of writing, a control apparatus according to the present invention includes a first code generation part for generating a first error detection code from first information which is output as a result of execution of a predetermined program conducted by a first processor, and a second code generation part for generating a second error detection code from second information which is output as a result of execution of the program conducted by a second processor configured so as to output a same computation result as the first processor does. The control apparatus further includes a comparison control part for detecting whether the first information is same as the second information, detecting whether the first error detection code is same as the second error detection code, and controlling writing the first information or the second information into a main memory on the basis of a result of the detection.

At the time of writing in the control apparatus according to the present invention, the comparison control part detects a failure in the first processor, the second processor, and interfaces between these processors and the comparison control part by detecting whether the first information coincides with the second information. And the comparison control part detects a failure in the first code generation part, the second code generation part, and bus interfaces between these generation parts and the comparison control part.

In other words, in the control apparatus according to the present invention, the comparison control part can always detect a bit error which occurs in the first information or the second information. Furthermore, the comparison control part controls writing the first information and the second information into the main memory on the basis of the detected bit error. If a bit error is caused by a failure in each processor or each bus interface during the writing, therefore, the present invention makes it possible to prevent the first information or the second information from being written into the main memory.

In order to achieve the object at the time of reading, a control apparatus according to the present invention includes a comparison control part for detecting whether first information output by a first processor as a result of execution of a predetermined program is same as second information output by a second processor as a result of execution of the program configured so as to output a computation result which is same as that of the first processor, and controlling whether to read out stored information including first stored information and second stored information which is an error detection code of the first stored information from a main memory on the basis of a result of the detection. The control apparatus has a configuration further including a first code generation part responsive to control exercised by the comparison control part to read out the stored information, for generating a first error detection code from the first stored information and the first information and controlling inputting the stored information which is read out to the first processor, on the basis of the first error detection code and the second stored information, and a second code generation part responsive to control exercised by the comparison control part to read out the stored information, for generating a second error detection code from the first stored information and the second information and controlling inputting the stored information which is read out to the second processor, on the basis of the second error detection code and the second stored information.

At the time of reading in the control apparatus according to the present invention, the comparison control part detects a failure in the first processor, the second processor, and interfaces between these processors and the comparison control part by detecting whether the first information coincides with the second information. If a failure is detected, the comparison control part prevents stored information from being read out from the main memory.

If stored information is read out from the main memory, the first code generation part detects a failure in the main memory, and a bus interface between the main memory and the first code generation part by detecting whether the error detection code newly generated from the first stored information in the stored information and the first information is the same as the second stored information in the stored information. The second code generation part detects a failure in the main memory, and a bus interface between the main memory and the second code generation part by detecting whether the error detection code newly generated from the first stored information in the stored information and the second information is the same as the second stored information in the stored information.

When a failure is detected by either the first code generation part or the second code generation part, the first code generation part and the second code generation part prevents the first stored information from being input to the first processor and the second processor, respectively. If a bit error is caused by a failure in each processor or each bus interface during reading, therefore, the present invention makes it possible to prevent the bit error from being detected falsely and prevent the first stored information from being input to the first processor and the second processor.

According to the present invention, a failure which has occurred in each processor or each bus interface can be detected certainly. If a failure is detected at the time of writing, writing information into the main memory is inhibited. If a failure is detected at the time of reading, inputting information to each processor is inhibited. In other words, it is possible to detect a failure immediately and certainly and prevent continuation of processing in the unstable state. As a result, the safety is further improved.

Other objects, features and advantages of the invention will become apparent from the following description of the embodiments of the invention taken in conjunction with the accompanying drawings.

BRIEF DESCRIPTION OF THE DRAWINGS

FIG. 8 is a timing chart showing operation of a CPU apparatus employing a control apparatus according to an embodiment of the present invention; and FIGS. 9A and 9B are tables showing failure detection ranges of a CPU apparatus employing a control apparatus according to an embodiment of the present invention.

DETAILED DESCRIPTION OF THE EMBODIMENTS

Figure 1:
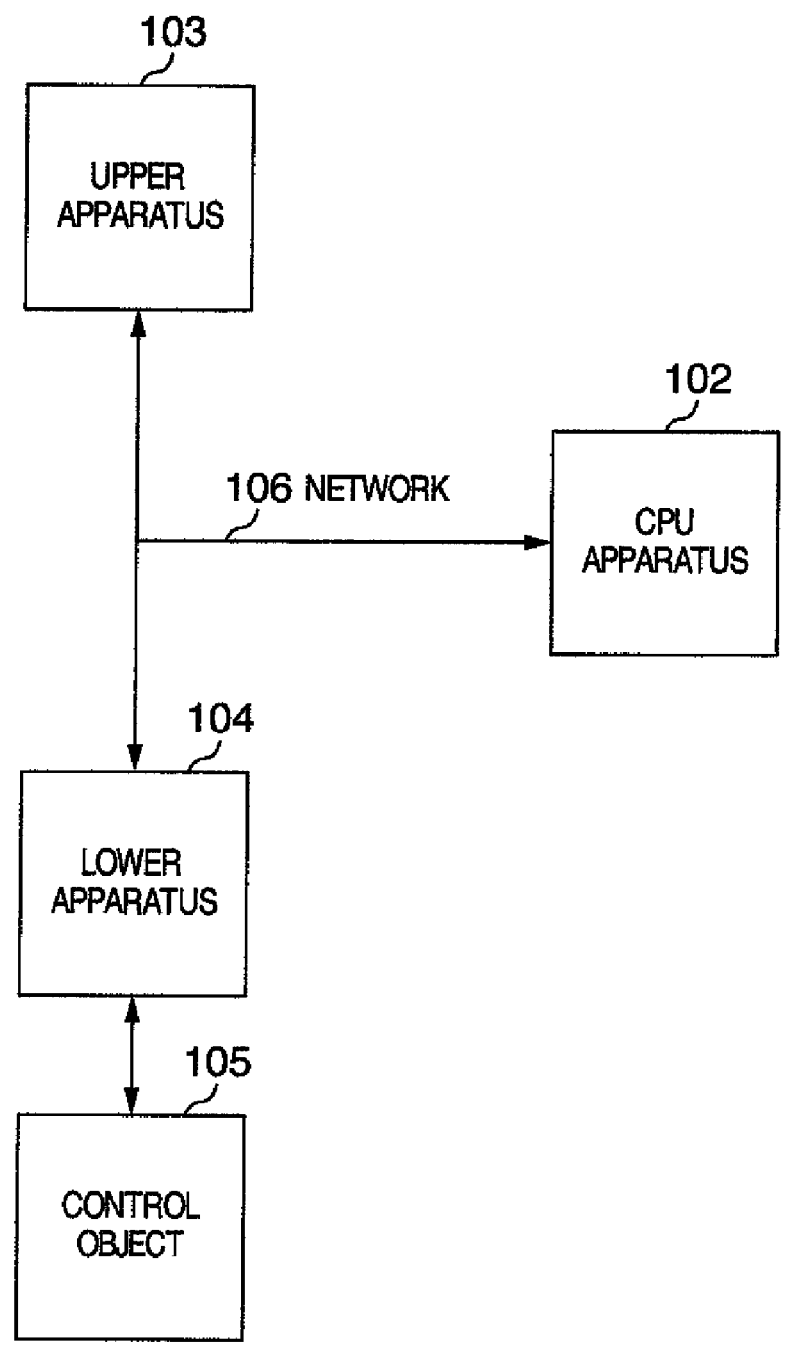
FIG. 1 is a block diagram showing a control system.

Hereafter, embodiments of the present invention will be described in the following order. The embodiments are provided with various restrictions which are technically desirable. However, the scope of the present invention is not restricted to those embodiments unless it is especially stated in the ensuing description that a requirement restricts the present invention. For example, numerical value conditions of respective parameters mentioned in the ensuing description are merely preferred examples. Dimensions, shapes and arrangement relations in the drawings used in the description are also schematic.

1. One Embodiment
   (1) Configuration of control system
   (2) Configuration of CPU apparatus
   (3) Configuration of A-system CRC circuit
   (4) Configuration of ECC circuit
   (5) Mode transition in CPU apparatus
   (6) Operation of CPU apparatus
   (7) Failure detection range in CPU apparatus 1. One Embodiment Configuration of Control System Hereafter, an embodiment of the present invention will be described with reference to FIGS. 1 to 9B.

FIG. 1 is a block diagram showing a control system according to an embodiment of the present invention.

The control system 101 includes a CPU apparatus 102, an upper apparatus 103, a lower apparatus 104, and a control object 105.

The upper apparatus 103 stores a predetermined program. The upper apparatus 103 is connected to the CPU apparatus 102 via a network 106.

The CPU apparatus 102 downloads the predetermined program from the upper apparatus 103 via the network 106, and conducts computation on the basis of the program. The CPU apparatus 102 is connected to the lower apparatus 104 as well via the network 106, and the CPU apparatus 102 outputs a result of the computation to the lower apparatus 104 via the network 106.

The CPU apparatus 102 includes a plurality of processors as described later, and conducts computation based on the program in either normal operation mode or safety-related operation mode. The normal operation mode is a mode in which independent computations are conducted in respective processors. The safety-related operation mode is a mode in which the same computation is conducted in the processors and soundness of the processors is confirmed by verifying whether results of the computation are the same. In addition, the CPU apparatus 102 operates in diagnostic operation mode in some cases. The diagnostic operation mode is a mode for verifying whether the CPU apparatus 102 operates normally on the basis of a diagnostic operation program stored in the CPU apparatus beforehand. At the time of the normal operation mode and the safety-related operation mode, the CPU apparatus 102 basically inputs the computation results to the lower apparatus 104. At the time of the diagnostic operation mode, the CPU apparatus 102 outputs nothing to the lower apparatus 104. In other words, in the diagnostic operation mode, control of the lower apparatus 104 is not exercised by the CPU apparatus 102. By the way, changeover among the normal operation mode, the safety-related operation mode, and the diagnostic operation mode is conducted by a scheduler, which is previously set in the CPU apparatus 102.

The lower apparatus 104 is an interface for conducting inputting and outputting of control information with respect to the control object 105. The lower apparatus 104 is connected to the control object 105 to operate the control object 105 on the basis of a computation result input from the CPU apparatus 102. The control object 105 is process facilities, such as an atomic power plant or a chemical plant, which are required to have safety when exercising control and which are potentially very dangerous.

(Configuration of CPU Apparatus)

The CPU apparatus 102 included in the control system 101 will now be described with reference to FIG. 2.

Figure 2:
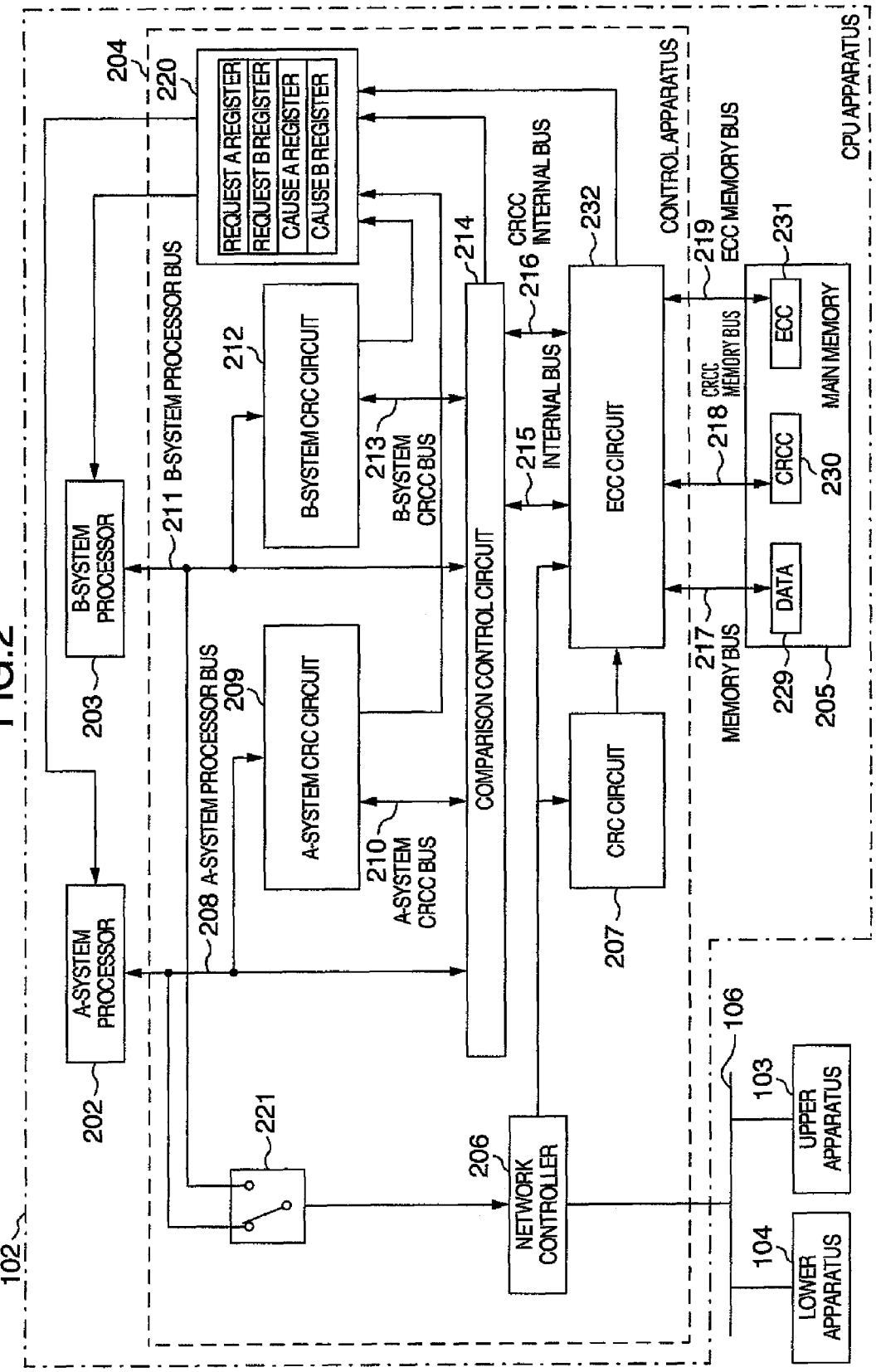
FIG. 2 is a block diagram showing a CPU apparatus employing a control apparatus according to an embodiment of the present invention.

FIG. 2 is a block diagram showing the CPU apparatus 102. Hereafter, it is supposed that the CPU apparatus 102 conducts computation in the safety-related operation mode on the basis of a program downloaded from the upper apparatus 103 by the CPU apparatus 102. Only when the CPU apparatus 102 downloads the predetermined program from the upper apparatus 103, however, the CPU apparatus 102 conducts operation different from the safety-related operation mode.

First, a configuration used when the CPU apparatus 102 downloads the predetermined program from the upper apparatus 103 will now be described. The configuration used in the CPU apparatus 102 at this time is formed of an A-system processor 202, a B-system processor 203, a part of a control apparatus 204, and a main memory 205. The part of the control apparatus 204 is formed of a network controller 206, a CRC circuit 207 and an ECC circuit 232. Hereafter, the embodiment will be described with reference to the case where the CPU apparatus 102 includes two processors: the A-system processor 202 and the B-system processor 203. However, there is no limitation in the number of processors and the present invention is not restricted by the number of processors.

Downloading of the predetermined program from the upper apparatus is conducted in a multi-task mode, i.e., by either the A-system processor 202 or the B-system processor 203. At this time, the network controller 206 acquires a data sequence having a 32-bit width which is a program from the upper apparatus 103 via the network 106. The network controller 206 includes a DMA (Direct Memory Access) controller, and determines a location in the main memory 205 at which the program is to be written. In other words, the network controller 206 generates a data sequence having a 32-bit width which is an address. The network controller 206 is connected to the CRC circuit 207 and the ECC circuit 232. The network controller 206 outputs the program acquired from the upper apparatus 103 and the generated address to the CRC circuit 207 and the ECC circuit 232.

The CRC circuit 207 generates an 8-bit CRCC (Cyclic Redundancy Check Code) from a data sequence having a 64-bit width which is obtained by putting the address and the program, which are input from the network controller 206, together. The CRC circuit 207 is connected to the ECC circuit 232, and the CRC circuit 207 outputs the generated CRCC to the ECC circuit 232. The ECC circuit 232 generates an ECC (Error-Correcting Code), which is a data sequence having an 8-bit width, from a data sequence having a width of 72 bits in total obtained by putting the CRCC, the program main body and the address together, and writes the program main body, the CRCC and the ECC into the main memory 205. The ECC circuit 232 is used in computation in the safety-related operation mode as well. Therefore, the ECC circuit 232 will be described in more detail in description of a configuration concerning the safety-related operation mode.

The main memory 205 has three areas: a data storage area 229, a CRCC storage area 230, and an ECC storage area 231. The data storage area 229 is an area in which the program is to be written. The CRCC storage area 230 is an area in which the CRCC generated by the CRC circuit is to be written via the network controller 206. The ECC storage area 231 is an area in which the ECC generated by the ECC circuit 232 is to be written via the network controller 206.

A configuration used by the CPU apparatus 102 when the CPU apparatus 102 conducts computation in the safety-related operation mode on the basis of the program downloaded from the upper apparatus 103 will now be described. The configuration used in the CPU apparatus 102 at this time is formed of the A-system processor 202, the B-system processor 203, the control apparatus 204 except the CRC circuit 207, and the main memory 205.

The A-system processor 202 executes the predetermined program downloaded from the upper apparatus 103, and processes a task. At that time, the A-system processor 202 writes/reads information into/from the main memory 205 via the control apparatus 204 for some tasks. The A-system processor 202 is connected to the control apparatus 204 by an A-system processor bus 208, and the A-system processor 202 causes information inputting to or information outputting from the control apparatus 204 via the A-system processor bus 208. At the time of writing, the A-system processor 202 outputs an address, data and a command to the control apparatus 204 via the A-system processor bus 208. On the other hand, at the time of reading, the A-system processor 202 outputs an address and a command to the control apparatus 204 via the A-system processor bus 208.

Each of the data and address is represented by a data sequence having a 32-bit data width. On the other hand, the command is 1-bit data for controlling the control apparatus 204 and the main memory 205. In the present embodiment, it is supposed that the control apparatus 204 and the main memory 205 conduct operation corresponding to writing when the command is "1" and conduct read operation when the command is "0."

The B-system processor 203 has the same function as that of the A-system processor 202. In other words, when executing the predetermined program downloaded from the upper apparatus 103 and processing on a task, the B-system processor 203 writes/reads information into/from the main memory 205 via the control apparatus 204 in accordance with the task. The B-system processor 203 is connected to the control apparatus 204 by a B-system processor bus 211, and the B-system processor 203 inputs information to or outputs information from the control apparatus 204 via the B-system processor bus 211. At the time of writing, the B-system processor 203 outputs an address, data and a command to the control apparatus 204 via the B-system processor bus 211. On the other time, at the time of reading, the B-system processor 203 outputs an address and a command to the control apparatus 204 via the B-system processor bus 211.

The control apparatus 204 detects whether there is a failure in each of blocks and buses included in the control apparatus 204, the A-system processor 202, the B-system processor 203, and the main memory 205.

The control apparatus 204 includes an A-system CRC circuit 209, a B-system CRC circuit 212, a comparison control circuit 214, the ECC circuit 232, and an interrupt control part 220. The control apparatus 204 further includes the network controller 206 and an output changeover switch 221.

The A-system CRC circuit 209 is a circuit for generating a CRCC from a data sequence having a width of a predetermined number of bits which is input.

The A-system CRC circuit 209 in the present embodiment conducts processing which differs depending upon whether to write or read data.

At the time of writing, the A-system CRC circuit 209 generates a CRCC from a data sequence having a 64-bit width obtained by putting the address and data input from the A-system processor 202 together. The A-system CRC circuit 209 is connected to the comparison control circuit 214 by an A-system CRCC bus 210, and the A-system CRC circuit 209 outputs the generated CRCC to the comparison control circuit 214.

At the time of reading, the A-system CRC circuit 209 newly generates a CRCC from a data sequence having a 64-bit width obtained by putting an address input from the A-system processor 202 and data written into the main memory 205 at the time of writing together. And the A-system CRC circuit 209 makes a decision whether the CRCC stored in the main memory 205 is the same data sequence as the newly generated CRCC.

The A-system CRC circuit 209 is connected to the interrupt control part 220. The A-system CRC circuit 209 generates a logic signal (hereafter referred to as "A-system CRC comparison non-coincidence") based on a result of the decision (coincidence/non-coincidence), and outputs the logic signal to the interrupt control part 220.

The B-system CRC circuit 212 is the same circuit as the A-system CRC circuit 209. The B-system CRC circuit 212 is a circuit for generating a CRCC from a data sequence having a width of a predetermined number of bits.

The B-system CRC circuit 212 in the present embodiment conducts processing which differs depending upon whether to write or read data.

At the time of writing, the B-system CRC circuit 212 generates a CRCC from a data sequence having a 64-bit width obtained by putting the address and data, which are input from the B-system processor 203, together. The B-system CRC circuit 212 is connected to the comparison control circuit 214 by a B-system CRCC bus 213, and the B-system CRC circuit 212 outputs the generated CRCC to the comparison control circuit 214.

At the time of reading, the B-system CRC circuit 212 newly generates a B-system CRCC from a data sequence having a 64-bit width obtained by putting an address input from the B-system processor 203 and data written into the main memory 205 at the time of writing together. And the B-system CRC circuit 212 makes a decision whether the CRCC stored in the main memory 205 is the same data sequence as the newly generated CRCC.

The B-system CRC circuit 212 is connected to the interrupt control part 220. The B-system CRC circuit 212 generates a logic signal (hereafter referred to as "B-system CRC comparison non-coincidence") based on a result of the decision (coincidence/non-coincidence), and outputs the logic signal to the interrupt control part 220. Hereafter, the CRCC generated by the A-system CRC circuit 209 is referred to as A-system CRCC, and the CRCC generated by the B-system CRC circuit 212 is referred to as B-system CRCC.

The comparison control circuit 214 is a circuit for making a decision whether two input data sequences coincide with each other. The comparison control circuit 214 is connected to the ECC circuit 232 by two buses: an internal bus 215 and a CRCC internal bus 216. In addition, the comparison control circuit 214 is connected to the interrupt control part 220 as well.

At the time of writing, the comparison control circuit 214 compares a data sequence having a 72-bit width obtained by putting the address and data which are input from the A-system processor 202 and the A-system CRCC which is input from the A-system CRC circuit 209 together, with a data sequence having a 72-bit width obtained by putting the address and data which are input from the B-system processor 203 and the B-system CRCC which is input from the B-system CRC circuit 212 together, and makes a decision whether they coincide with each other. At this time, the comparison control circuit 214 generates a logic signal (hereafter referred to as "comparison non-coincidence") based on a result of the decision (coincidence/non-coincidence) of the data sequence, and outputs the logic signal to the interrupt control part 220. Only when the data sequences coincide with each other, i.e., the decision result is coincidence, the comparison control circuit 214 outputs the address, data and command, which are input from the A-system processor 202, to the ECC circuit 232 via the internal bus 215 and outputs the A-system CRCC to the ECC circuit 232 via the CRCC internal bus 216.

At the time of reading, the comparison control circuit 214 compares a data sequence of the address which is input from the A-system processor 202 with a data sequence of the address which is input from the B-system processor 203, and makes a decision whether they coincide with each other. At this time, the comparison control circuit 214 generates "comparison non-coincidence" on the basis of a result of the decision (coincidence/non-coincidence), and outputs the "comparison non-coincidence" to the interrupt control part 220. Only when the data sequences coincide with each other, i.e., the decision result is coincidence, the comparison control circuit 214 outputs the address and command, which are input from the A-system processor 202, to the ECC circuit 232 via the internal bus 215.

The ECC circuit 232 generates an ECC from a bit string having a width of a predetermined number of bits. The ECC circuit 232 detects an error of the data sequence by utilizing the generated ECC. If the detected error is a 1-bit error which can be corrected, then the ECC circuit 232 corrects the data sequence.

The ECC circuit 232 conducts processing which differs depending upon whether to write or read data. The ECC circuit 232 is connected to the main memory 205 via a memory bus 217, a CRCC memory bus 218 and an ECC memory bus 219 so as to be able to exchange data sequences between the ECC circuit 232 and the main memory 205.

At the time of writing, the ECC circuit 232 generates an ECC from a data sequence having a 72-bit width obtained by putting the address, data and CRCC, which are input from the comparison control circuit 214, together. And the ECC circuit 232 outputs the generated ECC to the main memory 205 via the ECC memory bus 219. The ECC circuit 232 outputs the address, data and command, which are input from the comparison control circuit 214, to the main memory 205 via the memory bus 217, and outputs the CRCC, which is input from the comparison control circuit 214, to the main memory 205 via the CRCC memory bus 218.

At the time of reading, the ECC circuit 232 newly generates an ECC from a data sequence having a 72-bit width obtained by putting data written into the main memory 205 and the address and CRCC, which are input from the comparison control circuit 214. And the ECC circuit 232 makes a decision whether the newly generated ECC coincides with the ECC written into the main memory 205. The ECC circuit 232 is connected to the interrupt control part 220. The ECC circuit 232 generates a logic signal (hereafter referred to as "ECC comparison non-coincidence") on the basis of a result of the decision (coincidence/non-coincidence), and outputs the logic signal to the interrupt control part 220.

If the result of the decision is "coincidence," the ECC circuit 232 outputs the data and CRCC written into the main memory 205 to the A-system CRC circuit 209 and the B-system CRC circuit 212 via the comparison control circuit 214, generates "ECC comparison non-coincidence (coincidence)," and outputs the "ECC comparison non-coincidence (coincidence)" to the interrupt control part 220.

If the result of the decision is non-coincidence, then the ECC circuit 232 conducts an error check of the ECC and CRCC written into the main memory 205 by utilizing the newly generated ECC and the ECC written into the main memory 205.

In the case of an error which can be corrected, the ECC circuit 232 conducts error correction on the data and CRCC, and outputs the data and CRCC subjected to the error correction to the A-system CRC circuit 209 and the B-system CRC circuit 212 via the comparison control circuit 214. In addition, the ECC circuit 232 generates "ECC comparison non-coincidence (coincidence)," and outputs it to the interrupt control part 220.

In the case of an error which cannot be corrected, the ECC circuit 232 generates "ECC comparison non-coincidence (non-coincidence)," and outputs it to the interrupt control part 220.

The interrupt control part 220 outputs an A-system interrupt request to the A-system processor 202, and outputs a B-system interrupt request to the B-system processor 203. The interrupt control part 220 has a function of controlling an A-system interrupt request and a B-system interrupt request. The interrupt control part 220 includes an A-system interrupt request register for asserting an A-system interrupt request and an A-system interrupt cause register which indicates its interrupt cause. In addition, the interrupt control part 220 includes a B-system interrupt request register for asserting a B-system interrupt request and a B-system interrupt cause register which indicates its interrupt cause.

The interrupt control part 220 can control an A-system interrupt request for the A-system processor 202 and a B-system interrupt request for the B-system processor 203 independently.

The A-system interrupt request register, the B-system interrupt request register, the A-system interrupt cause register and the B-system interrupt cause register are adapted to be accessible from the A-system processor 202 and the B-system processor 203.

The interrupt control part 220 has a function of preventing the control apparatus 204 from being in an unsafe state upon detecting an abnormality in a processor, an abnormality in an interface between a processor and the main memory 205, or an abnormality in the main memory 205. In other words, the interrupt control part 220 makes a decision whether to discontinue computations which are being conducted by the A-system processor 202 and the B-system processor 203 at the present time, on the basis of a logic signal of one of the "A-system CRC comparison non-coincidence" supplied from the A-system CRC circuit 209, the "B-system CRC comparison non-coincidence" supplied from the B-system CRC circuit 212, the "comparison non-coincidence" supplied from the comparison circuit 214, and the ECC comparison non-coincidence" supplied from the ECC circuit 232. The interrupt control part 220 exercises control with respect to other interrupt causes as well. However, it is not mentioned herein.

By the way, the output changeover switch 221 is connected to the A-system processor 202, the B-system processor 203 and the network controller 206. The output changeover switch 221 selects a computation result of either the A-system processor 202 or the B-system processor 203, and outputs a computation result of the selected processor to the network controller 206. In other words, the output changeover switch 221 is a switch for outputting the computation result of the selected processor to the upper apparatus 103 or the lower apparatus 104 existing on the network 106, via the network controller 206.

(Configuration of A-System CRC Circuit)

An example of a circuit configuration of the A-system CRC circuit 209 and the B-system CRC circuit 212 will now be described with reference to FIG. 3.

Figure 3:
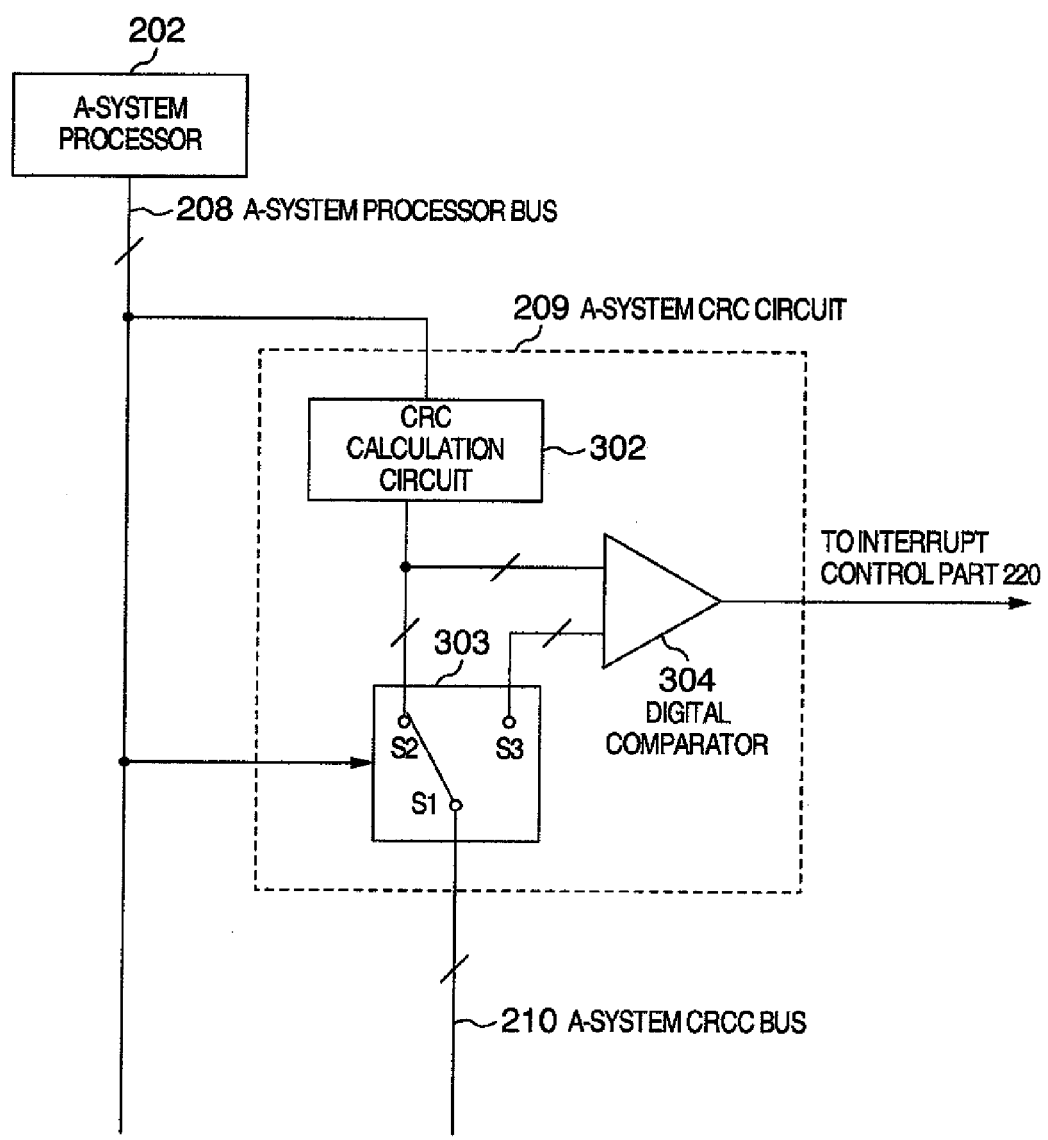
FIG. 3 is a block diagram showing an A-system CRC circuit.

FIG. 3 is a diagram showing an example of the A-system CRC circuit 209 and its periphery. Since the A-system CRC circuit 209 and the B-system CRC circuit 212 have the same circuit, description of the B-system CRC circuit 212 will be omitted.

The A-system CRC circuit 209 includes a CRC calculation circuit 302 connected to the A-system processor 202 and the comparison control circuit 214 via the A-system processor bus 208, a switch 303 connected to the comparison control circuit 214 via the A-system CRCC bus 210, and a digital comparator 304.

A terminal S2 of the switch 303 is connected to the CRC calculation circuit 302 and the digital comparator 304. A terminal S1 of the switch 303 is connected to the comparison control circuit 214 via the CRCC bus. A terminal S3 of the switch S3 is connected to the digital comparator 304. The switch 303 changes over a connected terminal on the basis of a command which is input from the A-system processor 202. Specifically, the switch 302 connects the terminal S1 to the terminal S2 when the input command is '1', i.e., at the time of writing, whereas the switch 302 connects the terminal S1 to the terminal S3 when the input command is '0', i.e., at the time of reading.

At the time of writing, the CRC calculation circuit 302 calculates the A-system CRCC from the address and data which are input from the A-system processor 202, and outputs the calculated A-system CRCC to the digital comparator 304.

At the time of reading, the CRC calculation circuit 302 calculates the A-system CRCC on the basis of the address which is input from the A-system processor 202 and the data acquired from the main memory 205 via the comparison control circuit 214. And the CRC calculation circuit 302 outputs the calculated A-system CRCC to the digital comparator 304.

The digital comparator 304 operates only at the time of reading. The digital comparator 304 compares the A-system CRCC calculated by the CRC calculation circuit 302 with the CRCC acquired from the main memory 205 via the comparison control circuit 214. The digital comparator 304 outputs the "A-system CRCC comparison non-coincidence," which is a logic signal depending upon a result of the comparison, to the interrupt control part 220.

(Configuration of ECC Circuit)

An example of a circuit configuration of the ECC circuit 232 will now be described with reference to FIG. 4.

Figure 4:
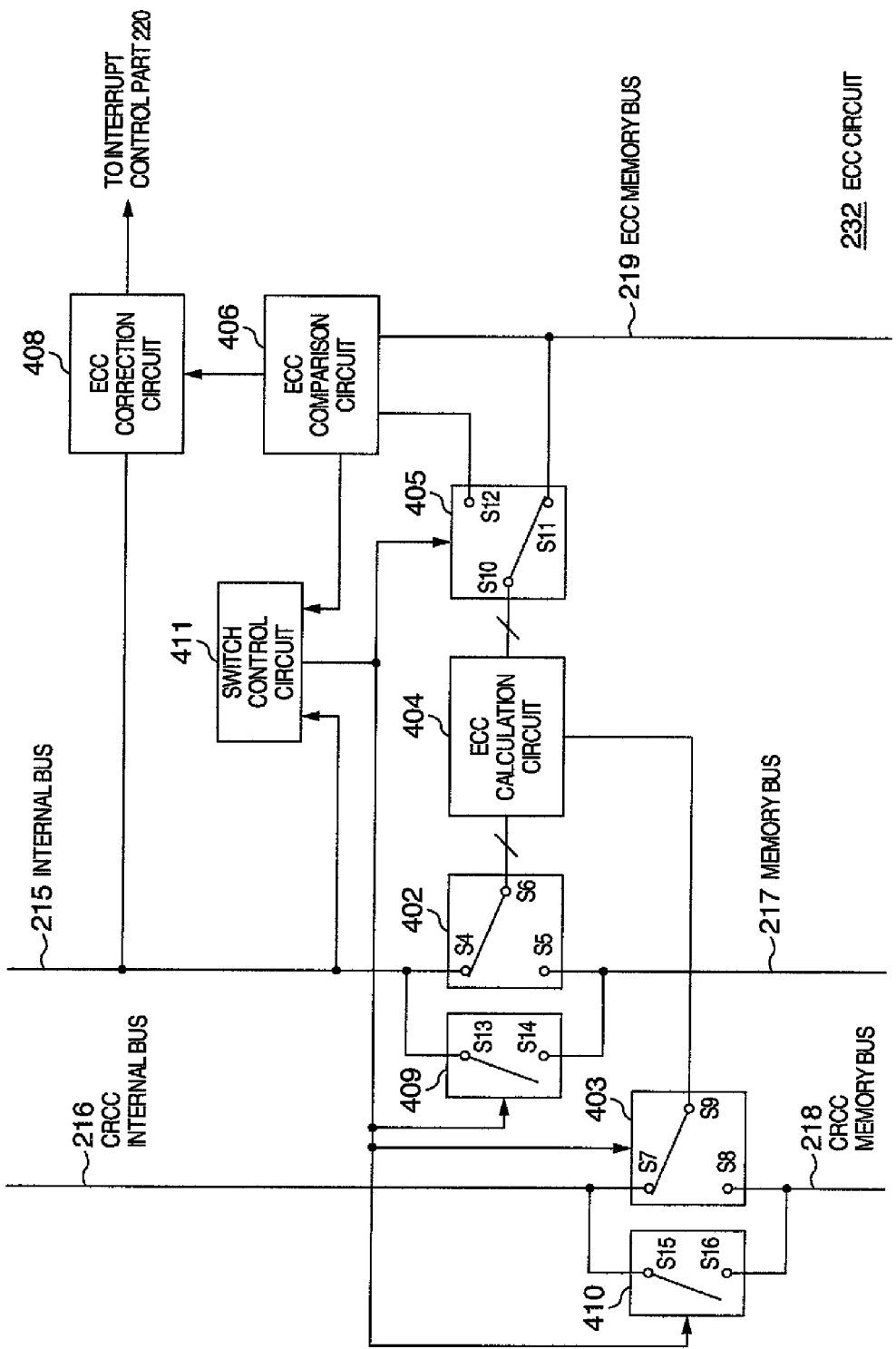
FIG. 4 is a block diagram showing an ECC circuit.

FIG. 4 is a diagram showing an example of the ECC circuit 232 and its periphery.

The ECC circuit 232 includes a first changeover switch 402, a second changeover switch 403, an ECC calculation circuit 404, a third changeover switch 405, an ECC comparison circuit 406, an ECC correction circuit 408, a fourth changeover switch 409, a fifth changeover switch 410 and a switch control circuit 411.

The first changeover switch 402 is a switch for connecting the ECC calculation circuit 404 to either the internal bus 215 or the memory bus 217.

A terminal S4 of the first changeover switch 402 is connected to the comparison control circuit 214 via the internal bus 215. A terminal S5 of the first changeover switch 402 is connected to the main memory 205 via the memory bus 217. A terminal S6 of the first changeover switch 402 is connected to the ECC calculation circuit 404. The first changeover switch 402 is controlled in connected terminal by the switch control circuit 411. Specifically, at the time of writing, the ECC calculation circuit 404 is connected to the internal bus 215 by connecting the terminal S6 to the terminal S4. On the other hand, at the time of reading, the ECC calculation circuit 404 is connected to the memory bus 217 by connecting the terminal S6 to the terminal S5.

The second changeover switch 403 is a switch for connecting the ECC calculation circuit 404 to either the CRCC internal bus 216 or the CRCC memory bus 218.

A terminal S7 of the second changeover switch 403 is connected to the comparison control circuit 214 via the CRCC internal bus 216. A terminal S8 of the second changeover switch 403 is connected to the main memory 205 via the CRCC memory bus 218. A terminal S9 of the second changeover switch 403 is connected to the ECC calculation circuit 404. The second changeover switch 403 is controlled in connected terminal by the switch control circuit 411. Specifically, at the time of writing, the ECC calculation circuit 404 is connected to the CRCC internal bus 216 by connecting the terminal S9 to the terminal S7. On the other hand, at the time of reading, the ECC calculation circuit 404 is connected to the CRCC memory bus 218 by connecting the terminal S9 to the terminal S8.

At the time of writing, the ECC calculation circuit 404 generates an ECC on the basis of the address and data which are input from the comparison control circuit 214 via the internal bus 215 and the CRCC which is input from the comparison control circuit 214 via the CRCC internal bus 216, and outputs the generated ECC via the third changeover switch 405.

On the other hand, at the time of reading, the ECC calculation circuit 404 generates an ECC on the basis of the data acquired from the main memory 205 via the memory bus 217, the CRCC acquired from the main memory 205 via the CRCC memory bus 218, and the address which is input from the comparison control circuit 214 via the internal bus 215. The ECC calculation circuit 404 outputs the generated ECC via the third changeover switch 405.

The third changeover switch 405 is a switch for conducting changeover to couple the output of the ECC circuit 232 to either the ECC comparison circuit 406 or the main memory 205.

A terminal S10 of the third changeover switch 405 is connected to the ECC calculation circuit 404. A terminal S12 of the third changeover switch 405 is connected to the ECC comparison circuit 406. A terminal S11 of the third changeover switch 405 is connected to the main memory 205 via the ECC memory bus 219. The third changeover switch 405 is controlled in connected terminal by the switch control circuit 411. Specifically, at the time of writing, the ECC generated by the ECC calculation circuit 404 is output to the ECC memory bus 219 by connecting the terminal S10 to the terminal S11. On the other hand, at the time of reading, the ECC generated by the ECC calculation circuit 404 is output to the ECC comparison circuit 406 by connecting the terminal S10 to the terminal S12.

The ECC comparison circuit 406 conducts processing only at the time of reading in accordance with the third changeover switch 405. The ECC comparison circuit 406 calculates an exclusive OR of data sequences of the ECC acquired from the main memory 205 via the ECC memory bus 219 and the ECC generated by the ECC calculation circuit 404. In this way, the ECC comparison circuit conducts error check of these ECCs. A result of this error check is "no error" (coincidence of all bits), "one-bit error", or "error of at least two bits." It is also detected whether each error, if any, can be corrected. The ECC comparison circuit 406 outputs such an error check result to the ECC correction circuit 408 and the switch control circuit 411.

The ECC correction circuit 408 conducts processing only at the time of reading in accordance with the third changeover switch 405. The ECC correction circuit 408 conducts error correction of the data and CRCC which are read out from the main memory 205, on the basis of the error check result which is input from the ECC comparison circuit 406

In the case of "uncorrectable one-bit error" or "uncorrectable error of at least two bits," the ECC correction circuit 408 outputs "ECC comparison non-coincidence (non-coincidence)" to the interrupt control part 220.

In the case of "correctable one-bit error," the ECC correction circuit 408 conducts bit correction on the data or CRCC read out from the main memory 205, by utilizing the error check result which is input from the ECC comparison circuit 406. In addition, the ECC correction circuit 408 outputs the "ECC comparison non-coincidence (coincidence)".

The fourth changeover switch 409 is a switch for changing over on/off of connection between the internal bus 215 and the memory bus 217. A terminal S13 of the fourth changeover switch 409 is connected to the internal bus 215. A terminal S14 of the fourth changeover switch 409 is connected to the memory bus 217. The fourth changeover switch 409 is controlled in on/off by the switch control circuit 411. At the time of writing, the terminal S13 is connected to the terminal S14 to output the address, data and command which are input from the comparison control circuit 214, to the main memory 205. If the error check result detected by the ECC comparison circuit 406 at the time of reading is "no error" or "correctable one-bit error," the terminal S13 is connected to the terminal S14 to output the data stored in the main memory 205 to the comparison control circuit 214.

The fifth changeover switch 410 is a switch for changing over on/off of connection between the CRCC internal bus 216 and the CRCC memory bus 218. A terminal S15 of the fifth changeover switch 410 is connected to the CRCC internal bus 216. A terminal S16 of the fifth changeover switch 410 is connected to the CRCC memory bus 218. The fifth changeover switch 410 is controlled in on/off by the switch control circuit 411. At the time of writing, the terminal S15 is connected to the terminal S16 to output the CRCC which is input from the comparison control circuit 214, to the main memory 205. If the error check result detected by the ECC comparison circuit 406 at the time of reading is "no error" or "correctable one-bit error," the terminal S15 is connected to the terminal S16 to output the CRCC stored in the main memory 205 to the comparison control circuit 214.

The switch control circuit 411 controls terminal connections in the first changeover switch 402, the second changeover switch 403, the third changeover switch 405, the fourth changeover switch 409 and the fifth changeover switch 410. The control is exercised on the basis of a command which is input from the comparison control circuit 214 via the internal bus 215 and the error check result which is input from the ECC comparison circuit 406.

(Mode Transition in CPU Apparatus)

Figure 5:
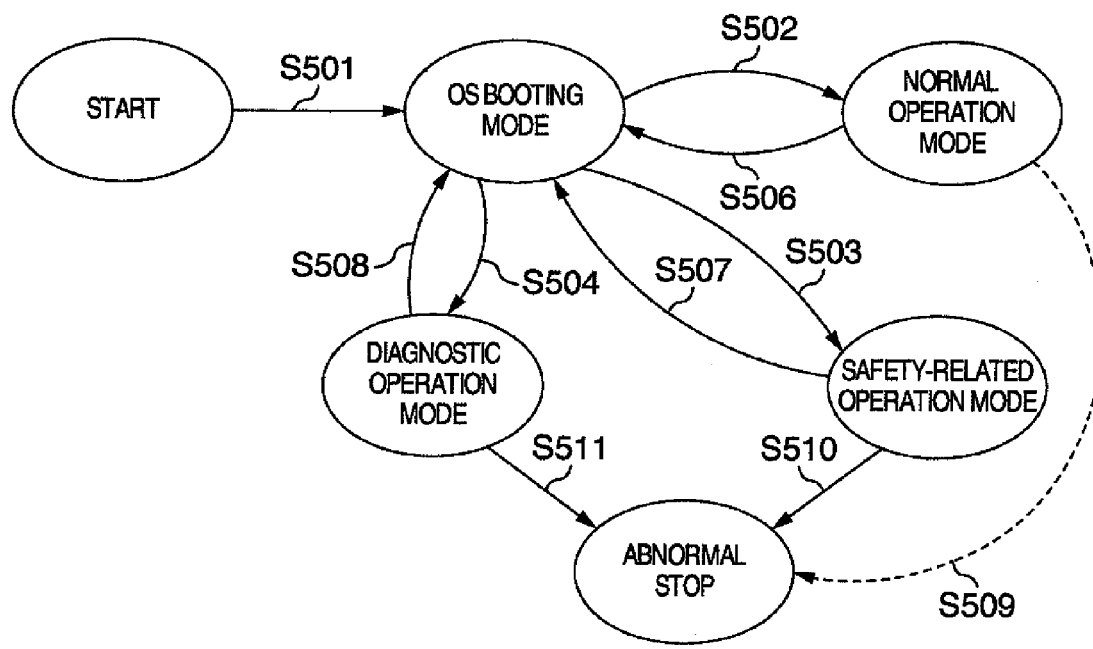
FIG. 5 is a state transition diagram showing a mode transition of the CPU apparatus.

Mode transition in the CPU apparatus 102 will now be descried with reference to FIG. 5.

FIG. 5 is a state transition diagram showing mode transition in the CPU apparatus 102.

First, if the CPU apparatus 102 is started, then the CPU apparatus 102 is brought into OS booting mode (step S501). At this time, the CPU apparatus 102 acquires the predetermined program stored in the upper apparatus 103 via the network.

The CPU apparatus 102 is operated in one of the normal operation mode (step S502), the safety-related operation mode (step S503) and the diagnostic operation mode (step S504) by the scheduler. If a mode change is conducted by the scheduler, then a shift to the OS booting mode is conducted (the step S506, the step S507 and the step S508).

If an abnormality occurs in the CPU apparatus 102 during computation in the normal operation mode, then the CPU apparatus 102 suspends the computation (step S509).

If an abnormality occurs in the CPU apparatus 102 during computation in the safety-related operation mode, then the CPU apparatus 102 suspends the computation (step S510).

If a failure in each of blocks and buses included in the CPU apparatus 102 is detected by execution in the diagnostic operation mode, i.e., execution of a diagnostic operation program, the CPU apparatus 102 is stopped (step S511).

In order to detect an error for the step S510 among the states described heretofore, the CPU apparatus 102 has configurations shown in FIGS. 2 to 4. In other words, the configurations shown in FIGS. 2 to 4 in the present embodiment are provided to detect an abnormality in the CPU apparatus 102 in the safety-related operation mode and bring the CPU apparatus 102 into the abnormal stop mode.

(Operation of CPU Apparatus)

Operation of the control apparatus 204 in the safety-related mode will now be described with reference to FIGS. 6 to 8.

Figure 6:
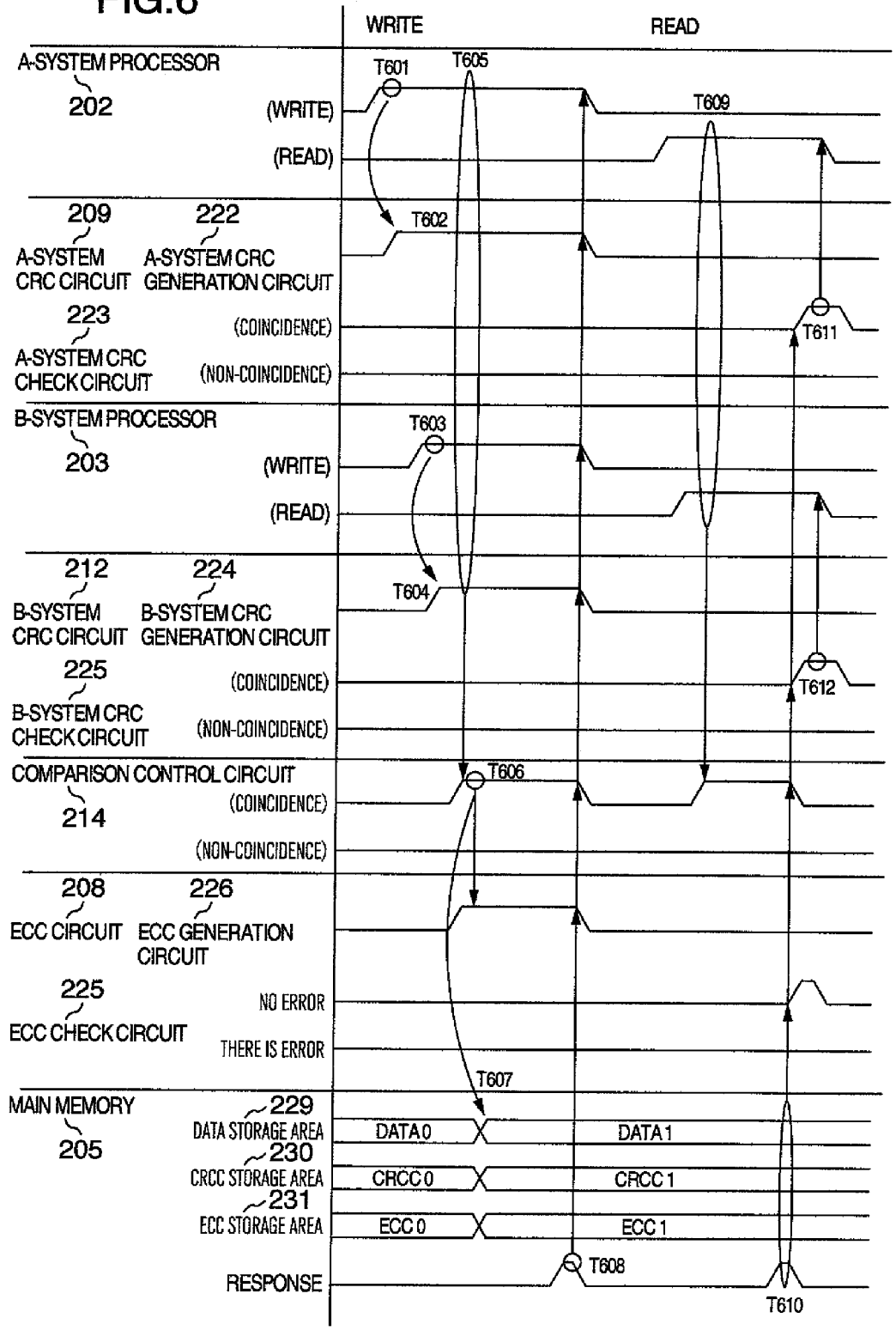
FIG. 6 is a timing chart showing operation of a CPU apparatus employing a control apparatus according to an embodiment of the present invention.

FIG. 6 is a timing chart showing operation of the control apparatus 204 in the case where there are no failures.

Operation of the control apparatus 204 at the time when the A-system processor 202 and the B-system processor 203 conduct writing on the main memory 205 on the basis of the predetermined program acquired from the upper apparatus 103 beforehand will now be described. Since the B-system CRC circuit 212 has the same configuration as the A-system CRC circuit 209, operation concerning the B-system CRC circuit will be described hereafter with reference to the A-system CRC circuit shown in FIG. 3.

Upon issuing a write request to the main memory 205 (T601), the A-system processor 202 outputs the address and data and a command which indicates writing ('1') to the A-system CRC circuit 209 and the comparison control circuit 214 in the control apparatus 204 via the A-system processor bus 208. Thereupon, the A-system CRC circuit 209 is triggered by the command which is input from the A-system processor 202 to connect the terminal S1 in the switch 303 to the terminal S2. And the CRC calculation circuit 302 in the A-system CRC circuit 209 generates the A-system CRCC on the basis of the address and data which are input from the A-system processor 202. And the A-system CRC calculation circuit 302 outputs the generated A-system CRCC to the comparison control circuit 214 via the A-system CRCC bus 210 (T602).

On the other hand, the B-system processor 203 also conducts operation similar to that of the A-system processor 202. Upon issuing a write request to the main memory 205 (T603), the B-system processor 203 outputs the address and data and a command which indicates writing ('1') to the B-system CRC circuit 212 and the comparison control circuit 214 in the control apparatus 204 via the B-system processor bus 211. Thereupon, the B-system CRC circuit 212 is triggered by the command which is input from the B-system processor 203 to connect the terminal S1 in the switch 303 to the terminal S2. And the CRC calculation circuit 302 in the B-system CRC circuit 212 generates the B-system CRCC on the basis of the address and data which are input from the B-system processor 203. And the B-system CRC calculation circuit 302 outputs the generated B-system CRCC to the comparison control circuit 214 via the B-system CRCC bus 213 (T604).

The comparison control circuit 214 makes a decision whether the A-system CRCC which is input from the CRC calculation circuit 302 in the A-system CRC circuit 209 coincides with the B-system CRCC which is input from the CRC calculation circuit 302 in the B-system CRC circuit 212 (T605). If there is no failure in each failure detection part, then the decision result becomes "coincidence" and consequently the comparison control circuit 214 outputs the address, data and command, which are input from the A-system processor 202 via the A-system processor bus 208, to the ECC circuit 232 via the internal bus 215. In addition, the comparison control circuit 214 outputs the A-system CRCC, which is input from the A-system CRC circuit 209, to the ECC circuit 232 via the CRCC internal bus 216. By the way, output of the B-system CRC circuit 212 may be input to the ECC circuit 232. Hereafter, therefore, the A-system CRCC and the B-system CRCC will be simply referred to as CRCC without a distinction between them.

The ECC circuit 232 is triggered by the command, which is input from the comparison control circuit, to connect the terminal S4 to the terminal S6 in the first changeover switch 402, connect the terminal S7 to the terminal S9 in the second changeover switch 403, connect the terminal S10 to the terminal S11 in the third changeover switch 405, connect the terminal S13 to the terminal S14 in the fourth changeover switch 409, and connect the terminal S15 to the terminal S16 in the fifth changeover switch 410. The ECC calculation circuit 404 generates the ECC on the basis of the address, data and CRCC, which are input from the comparison control circuit 21, and outputs the generated ECC to the main memory 205 via the ECC memory bus 219. At this time, the ECC circuit 232 outputs the data, command and data, which are input from the comparison control circuit 214, to the main memory 205 via the memory bus 217, and outputs the CRCC, which is input from the comparison control circuit 214, to the main memory 205 via the CRCC memory bus 218 (T606).

The main memory 205 is triggered by the command, which is input from the ECC circuit 232, to store the data, CRCC and ECC, which are input from the ECC circuit 232, in a location indicated by each address, which is input from the ECC circuit. In other words, the main memory 205 stores the data storage area 229, stores the CRCC in the CRCC storage area 230, and stores the ECC in the ECC storage area 231 (T607).

If the processing heretofore described is completed and the main memory 205 outputs a write end response to respective circuits in the control apparatus 204, then the respective circuits in the main memory 205 finish the write operation (T608).

Operation of the control apparatus 204 at the time when the A-system processor 202 and the B-system processor 203 conduct reading from the main memory 205 on the basis of the predetermined program acquired from the upper apparatus 103 beforehand will now be described.

First, the A-system processor 202 and the B-system processor 203 issues a read request to the control apparatus 204. Thereupon, the A-system processor 202 outputs the address and a command which indicates reading ('0') to the comparison control circuit 214 in the control apparatus 204 via the A-system processor bus 208. In addition, the A-system processor 202 outputs the command to the A-system CRC circuit 209. The A-system CRC circuit 209 is triggered by the command, which is input from the A-system processor 202, to connect the terminal S1 to the terminal S3 in the switch 303.

On the other hand, the B-system processor 203 outputs the address and a command which indicates reading ('0') to the comparison control circuit 214 in the control apparatus 204 via the A-system processor bus 208. In addition, the B-system processor 203 outputs the command to the B-system CRC circuit 212. The B-system CRC circuit 212 is triggered by the command, which is input from the B-system processor 203, to connect the terminal S1 to the terminal S3 in the switch 303.

The comparison control circuit 214 compares the address which is input from the A-system processor 202 with the address which is input from the B-system processor 203, and makes a decision whether a result of the comparison is "coincidence" (T609).

If the decision is "coincidence," then the comparison control circuit outputs the address and command, which are input from the A-system processor, to the ECC circuit 232 via the internal bus 215. Thereupon, the ECC circuit 232 is triggered by the command, which is input from the comparison control circuit 214, to connect the terminal S5 to the terminal S6 in the first changeover switch 402, connect the terminal S8 to the terminal S9 in the second changeover switch 403, and connect the terminal S10 to the terminal S12 in the third changeover switch 405. And the ECC circuit 232 outputs the address and command, which are input from the comparison control circuit 214, to the main memory 205 via the memory bus 217.

The main memory 205 is triggered by the command, which is input from the ECC circuit 232, to output the data stored in the main memory 205 to the ECC circuit 232 via the memory bus 217 in accordance with the address, which is input from the ECC circuit 232. At this time, the main memory 205 outputs the stored CRCC to the ECC circuit 232 via the CRCC memory bus 218 in accordance with the address, which is input from the ECC circuit 232. In addition, the main memory 205 outputs the stored ECC to the ECC circuit 232 via the ECC memory bus 219 in accordance with the address, which is input from the ECC circuit 232.

Thereupon, the ECC calculation circuit 404 in the ECC circuit 232 newly generates an ECC on the basis of the address, which is input from the comparison control circuit 214, and the data and CRCC acquired from the main memory 205, and outputs the generated ECC to the ECC comparison circuit 406.

The ECC comparison circuit 406 calculates an exclusive OR of the newly generated ECC and the ECC acquired from the main memory 205. And the ECC comparison circuit 406 conducts the above-described error check, and outputs a result of the error check to the ECC correction circuit 408 and the switch control circuit 411. In this case, the error check result becomes "no error." Therefore, the switch control circuit 411 connects the terminal S13 to S14 in the fourth changeover switch 409 and connects the terminal S15 to S16 in the fifth changeover switch 410. Thereupon, the data acquired from the main memory 205 is output to the CRC calculation circuit 302 in the A-system CRC circuit 209 via the internal bus 215, the comparison control circuit 214 and the A-system processor bus 208. At this time, the CRCC acquired from the main memory 205 is output to the digital comparator 304 in the A-system CRC circuit 209 via the CRCC internal bus 216, the comparison control circuit 214 and the A-system CRCC bus 210. By the way, the data and CRCC acquired from the main memory 205 are input to the B-system CRC circuit 212 as well in the same way (T610).

Here, the CRC calculation circuit 302 in the A-system CRC circuit 209 newly generates a CRCC on the basis of the address, which is output from the A-system processor 202 via the A-system processor bus 208, and the data, which is input from the ECC circuit 232. The CRC calculation circuit 302 outputs the newly generated ECC to the digital comparator 304. The digital comparator 304 compares the newly generated CRCC with the CRCC, which is input from the ECC circuit 232, and makes a decision whether the comparison result is coincidence.

In the present case, the decision result becomes coincidence. The data, which is output from the ECC circuit 232, i.e., the data stored in the main memory is output to the A-system processor 202 via the A-system processor bus 208 (T611). At this time, the same data as that stored in the main memory 205 is output from the B-system CRC circuit 212 to the B-system processor 203 as well in the same way via the B-system processor bus 211 (T612).

Figure 7:
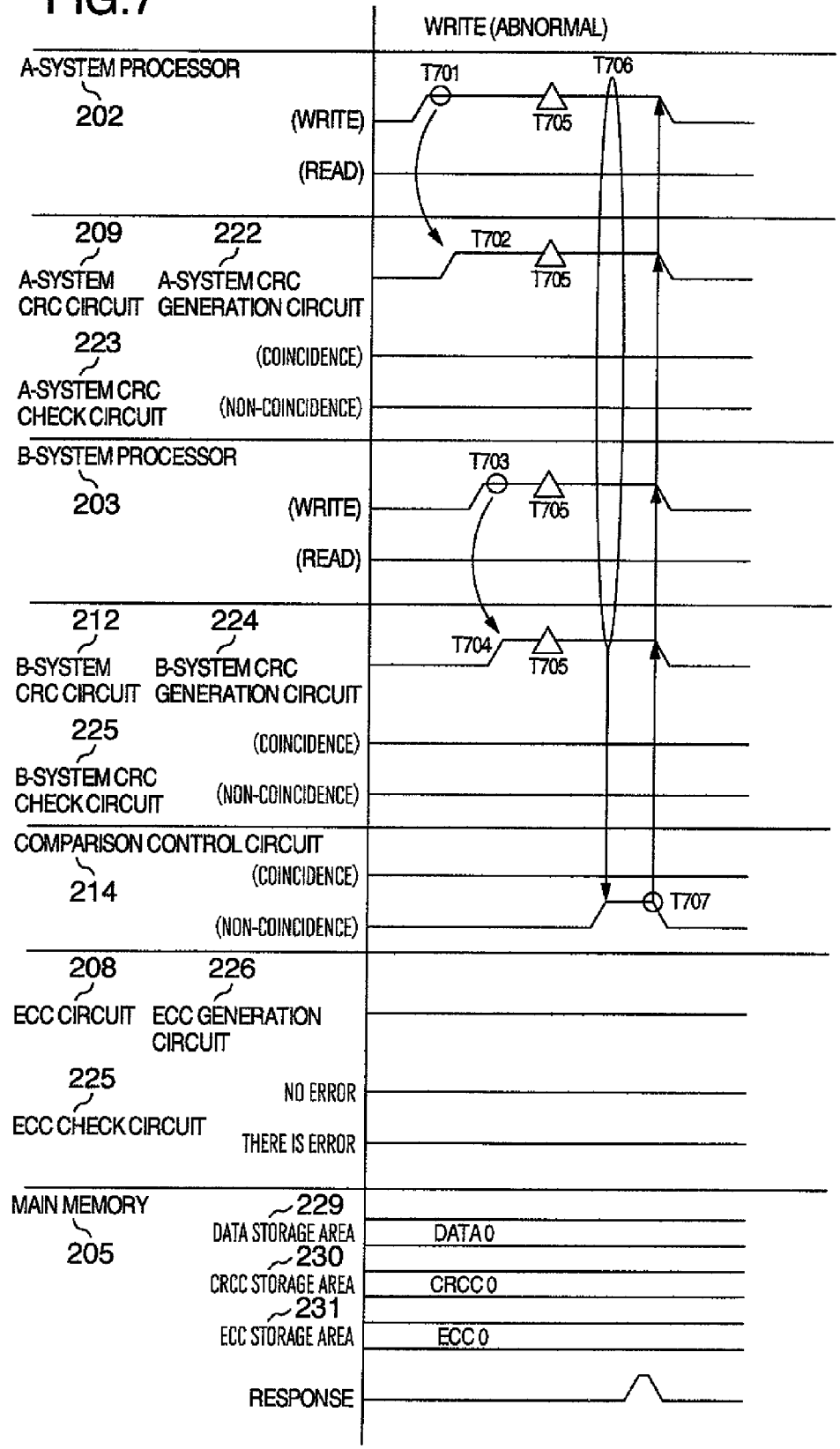
FIG. 7 is a timing chart showing operation of a CPU apparatus employing a control apparatus according to an embodiment of the present invention.

FIG. 7 is a timing chart showing operation of the control apparatus 204 in the case where a failure has occurred in one of the A-system processor 202, the A-system CRC circuit 209, the A-system processor bus 208, the B-system processor bus 203, the B-system CRC circuit 212 and the B-system processor bus 211. Since T701 to T704 are the same as T601 to T604 in FIG. 6, description of them will be omitted.

It is now supposed that a failure has occurred in one of the A-system processor 202, the A-system CRC circuit 209, the A-system processor bus 208, the B-system processor bus 203, the B-system CRC circuit 212 and the B-system processor bus 211 immediately after the timing T704, i.e., during the write operation (T705). Thereupon, the comparison control circuit 214 compares the A-system CRCC, which is input from the A-system CRC circuit 209 via the A-system CRCC bus 210, with the B-system CRCC, which is input from the B-system CRC circuit 212 via the B-system CRCC bus 213. And the comparison control circuit 214 makes a decision whether a result of the comparison is "coincidence" (T706).

In the present case, the result of the decision becomes "non-coincidence." Therefore, the comparison control circuit 214 returns a response to the A-system processor 202 and the B-system processor 203. Furthermore, the comparison control circuit 214 outputs "comparison non-coincidence (non-coincidence)" to the interrupt control part 220, and registers a cause in the A-system interrupt cause register and the B-system interrupt cause register. And the processing in the A-system processor 202 and the processing in the B-system processor 203 are discontinued temporarily by the A-system interrupt cause register and the B-system interrupt cause register at a time point of T707.

When a failure as in the present case has occurred, it is not conducted to write data into the main memory 205 and subsequent execution of the program is discontinued by the interrupt control part 220, as heretofore described.

Operation of the control apparatus 204 conducted when a failure has occurred in one of the comparison control circuit 214, the internal bus 215, the CRCC internal bus 216, the ECC circuit 232, the memory bus 217, the CRCC memory bus 218, the ECC memory bus 219 and the main memory 205 will now be described with reference to FIG. 8.

FIG. 8 is a timing chart showing operation of the control apparatus 204. By the way, since T801 to T809 are the same as T601 to T609 shown in FIG. 6, description of them will be omitted.

It is now supposed that a failure has occurred in one of the comparison control circuit 214, the internal bus 215, the CRCC internal bus 216, the ECC circuit 232, the memory bus 217, the CRCC memory bus 218, the ECC memory bus 219 and the main memory 205 immediately after the timing T809, i.e., during the read operation (T810).

The main memory 205 outputs data stored therein to the ECC circuit 232 via the memory bus 217 in accordance with the address which is input from the ECC circuit 232. At this time, the main memory 205 outputs the data stored therein to the ECC circuit 232 via the ECC memory bus 219 in accordance with the address which is input from the ECC circuit 232, and outputs the CRCC stored therein to the ECC circuit 232 via the CRCC memory bus 218 in accordance with the address which is input from the ECC circuit 232. And the ECC calculation circuit 404 in the ECC circuit 232 newly generates an ECC on the basis of the address, which is input from the comparison control circuit 214 via the internal bus 215, and the data and CRCC acquired from the main memory 205. The ECC calculation circuit 404 outputs the generated ECC to the ECC comparison circuit 406.

The ECC calculation circuit 404 conducts the above-described error check by calculating an exclusive OR of the newly generated ECC and the ECC read out from the main memory 205. And the ECC calculation circuit 404 outputs a result of the error check to the ECC comparison circuit 406 and the switch control circuit 411. In the present case, the error check result becomes "no error." Therefore, the switch control circuit 411 connects the terminal S13 to S14 in the fourth changeover switch 409 and connects the terminal S15 to S16 in the fifth changeover switch 410. Thereupon, the data acquired from the main memory 205 is output to the CRC calculation circuit 302 in the A-system CRC circuit 209 via the internal bus 215, the comparison control circuit 214 and the A-system processor bus 208. At this time, the CRCC acquired from the main memory 205 is output to the digital comparator 304 in the A-system CRC circuit 209 via the CRCC internal bus 216, the comparison control circuit 214 and the A-system CRCC bus 210. By the way, the data and CRCC acquired from the main memory 205 are input to the B-system CRC circuit 212 as well in the same way (T811).

The CRC calculation circuit 302 in the A-system CRC circuit 209 newly generates a CRCC on the basis of the address, which is output from the A-system processor 202 via the A-system processor bus 208, and the data, which is input from the ECC circuit 232. The CRC calculation circuit 302 outputs the newly generated ECC to the digital comparator 304 in the A-system CRC circuit 209. The digital comparator 304 compares the newly generated CRCC with the CRCC, which is input from the ECC circuit 232, and makes a decision whether the comparison result is coincidence (T812).

On the other hand, the CRC calculation circuit 302 in the B-system CRC circuit 212 newly generates a CRCC on the basis of the address, which is output from the B-system processor 203 via the B-system processor bus 211, and the data, which is input from the ECC circuit 232. The CRC calculation circuit 302 outputs the newly generated ECC to the digital comparator 304 in the B-system CRC circuit 212. The digital comparator 304 compares the newly generated CRCC with the CRCC, which is input from the ECC circuit 232, and makes a decision whether the comparison result is coincidence (T813).

In the present case, both or one of the digital comparator 304 in the A-system CRC circuit 209 and the digital comparator 304 in the B-system CRC circuit 212 judge the CRCCs to be non-coincident. Thereupon, the digital comparator 304 that has detected non-coincidence outputs "CRC comparison non-coincidence (non-coincidence)" to the interrupt control part 220, and registers a cause in the A-system interrupt cause register or the B-system interrupt cause register. And the processing in the A-system processor 202 and the processing in the B-system processor 203 are discontinued temporarily by the A-system interrupt cause register and the B-system interrupt cause register at the time point of T607.

When a failure as in the present case has occurred, it becomes impossible for the A-system processor 202 and the B-system processor 203 to read data and subsequent execution of the program is discontinued by the interrupt control part 220, as heretofore described.

(Failure Detection Range in CPU Apparatus)

The failure detection range in the CPU apparatus 102 will now be summarized.

FIGS. 9A and 9B are tables showing the failure detection range in the CPU apparatus 102.

FIG. 9A is a table showing the failure detection range in the CPU apparatus 102 when it is operating in the safety-related operation mode.

As described above, the CPU apparatus 102 includes the A-system CRC circuit 209, the B-system CRC circuit 212, the comparison control circuit 214 and the ECC circuit 232 as components for detecting failures in the blocks and buses (hereafter referred to as "failure detection object") included in the CPU apparatus 102 at the time of the safety-related operation mode.

Failure detection objects of the A-system CRC circuit 209 are the A-system processor bus 208, the comparison control circuit 214, the internal bus 215, the CRCC internal bus 216, the ECC circuit 232, the memory bus 217, the CRCC memory bus 218, the ECC memory bus 219 and the main memory 205.

Failure detection objects of the B-system CRC circuit 212 are the 3-system processor bus 211, the comparison control circuit 214, the internal bus 215, the CRCC internal bus 216, the ECC circuit 232, the memory bus 217, the CRCC memory bus 218, the ECC memory bus 219 and the main memory 205.

Failure detection objects of the comparison control circuit 214 are the A-system processor 202, the B—system processor 203, the A-system CRC circuit 209, the B-system CRC circuit 212, the A-system processor bus 208 and the B-system processor bus 211.

Failure detection objects of the ECC circuit 232 are the memory bus 217, the CRCC memory bus 218, the ECC memory bus 219 and the main memory 205.

FIG. 9B is a table showing the failure detection range in the CPU apparatus 102 when it is operating in the diagnostic operation mode. In the diagnostic operation mode, diagnoses of the A-system processor 202, the B-system processor 203, the A-system CRC circuit 209, the B-system CRC circuit 212, the A-system processor bus 208, the B-system processor bus 211, the comparison control circuit 214, the internal bus 215, the CRCC memory bus 218, the ECC memory bus 219 and the main memory 205 are conducted independently by operating diagnostic operation programs shown in the table in FIG. 9B. By the way, since failure detection objects are the same as those shown in the table in FIG. 9A, description concerning the failure detection objects will be omitted.

In the present embodiment, not only a failure is detected by simply comparing outputs of a plurality of processors and making a decision whether those outputs coincide or not, but also detection of a failure in the unit for conducting the comparison is made possible, as heretofore described. As a result, failures in the blocks and buses included in the CPU apparatus 102 during processing in the CPU apparatus 102 (at the time of the safety-related mode) can be detected more certainly. And if a failure is detected, the processing is immediately suspended. For example, even if some failure occurs during control of process facilities which are potentially very dangerous, the control is discontinued. As a result, an effect that the safety is further improved is obtained.

In the present embodiment, the ECC circuit 232 is provided. Even if the ECC circuit 232 is not provided, however, effects similar to those of the configurations described above are obtained. If the ECC circuit 232 is not provided, however, it becomes necessary that the internal bus 215 is connected to the memory bus 217 and the CRCC internal bus 216 is connected to the CRCC memory bus 218.

Heretofore, the embodiment of the present invention has been described. However, it is a matter of course that the present invention is not restricted to the above-described embodiment and other modifications and application examples are incorporated without departing from the spirit of the present invention described in claims.

It should be further understood by those skilled in the art that although the foregoing description has been made on embodiments of the invention, the invention is not limited thereto and various changes and modification may be made without departing from the spirit of the invention and the scope of the appended claims.

The invention claimed is:

1. A control apparatus comprising:
 a first code generation part for generating a first error detection code from first information which is output as a result of execution of a predetermined program conducted by a first processor;
 a second code generation part for generating a second error detection code from second information which is output as a result of execution of the program conducted by a second processor configured so as to output a same computation result as the first processor;
 a comparison control part for detecting whether the first information is same as the second information, detecting whether the first error detection code is same as the second error detection code, and controlling writing the first information or the second information into a main memory on a basis of a result of the detection; and
 a correction code generation part for generating an error correction code on a basis of either the first information or the second information and either the first error detection code or the second error detection code when the comparison control part has detected that the first information is the same as the second information and the first error detection code is the same as the second error detection code;
 wherein the correction code generation part controls writing the error correction code generated on a basis of a result of the detection conducted by the comparison control part, into the memory.

2. The control apparatus according to claim 1, further comprising an interrupt control part for registering a cause based on the result of the detection conducted by the comparison control part.

3. The control apparatus according to claim 2, wherein the interrupt control part issues an interrupt request to the first processor and the second processor on the basis of the registered cause.

4. A control apparatus comprising:
 a comparison control part for detecting whether first information output by a first processor as a result of execution of a predetermined program, is same as second information output by a second processor as a result of execution of the program configured so as to output a computation result which is same as that of the first processor, and controlling whether to read out stored information comprising first stored information and second stored information which is an error detection code of the first stored information from a main memory, on a basis of a result of the detection;
 a first code generation part responsive to control exercised by the comparison control part to read out the stored information, for generating a first error detection code from the first stored information and the first information, and controlling inputting the stored information which is read out to the first processor, on a basis of the first error detection code and the second stored information; and
 a second code generation part responsive to control exercised by the comparison control part to read out the stored information, for generating a second error detection code from the first stored information and the second information and controlling inputting the stored information which is read out to the second processor, on a basis of the second error detection code and the second stored information; and
 a correction code generation part for generating an error correction code on a basis of either the first information or the second information and either the first error detection code or the second error detection code when the comparison control part has detected that the first information is the same as the second information and the first error detection code is the same as the second error detection code,
 wherein the correction code generation part controls writing the error correction code generated on a basis of the result of the detection conducted by the comparison control part, into the memory.

5. The control apparatus according to claim 4, wherein
the stored information further comprises third stored information which is an error correction code generated on a basis of the first stored information and the second stored information, and
the correction code generation part detecting whether the generated error correction code is same as the third stored information, and controlling inputting the first information to the first processor and the second processor on the basis of a result of the detection.

6. The control apparatus according to claim 5, further comprising an interrupt control part for registering a cause based on a result of detection conducted by the comparison control part, the first code generation part, the second code generation part, or the correction code generation part.

7. The control apparatus according to claim 6, wherein the interrupt control part issues an interrupt request to the first processor and the second processor on the basis of the registered cause.

8. A control method comprising:
generating a first error detection code from first information which is output as a result of execution of a predetermined program conducted by a first processor;
generating a second error detection code from second information which is output as a result of execution of the program conducted by a second processor configured so as to output a same computation result as the first processor;
detecting whether the first information is same as the second information, detecting whether the first error detection code is same as the second error detection code, and controlling writing the first information or the second information into a main memory on a basis of a result of the detection; and
generating an error correction code on a basis of either the first information or the second information and either the first error detection code or the second error detection code when the comparison control part has detected that the first information is the same as the second information and the first error detection code is the same as the second error detection code,
wherein the generating controls writing the error correction code generated on a basis of the result of the detection conducted by the comparison control part, into the memory.

9. A control method comprising:
detecting whether first information output by a first processor as a result of execution of a predetermined program is same as second information output by a second processor as a result of execution of the program configured so as to output a computation result which is same as that of the first processor, and controlling whether to read out stored information comprising first stored information and second stored information which is an error detection code of the first stored information from a main memory on a basis of a result of the detection;
responsive to control exercised to read out the stored information, generating a first error detection code from the first stored information and the first information and controlling inputting the stored information which is read out to the first processor on a basis of the first error detection code and the second stored information;
responsive to control exercised to read out the stored information, generating a second error detection code from the first stored information and the second information and controlling inputting the stored information which is read out to the second processor on the basis of the second error detection code and the second stored information; and
generating an error correction code on a basis of either the first information or the second information and either the first error detection code or the second error detection code when the comparison control part has detected that the first information is the same as the second information and the first error detection code is the same as the second error detection code,
wherein the generating controls writing the error correction code generated on a basis of the result of the detection conducted by the comparison control part, into the memory.

\* \* \* \* \*